(12) United States Patent (10) Patent No.: US 9,893,175 B2
Mauder et al. (45) Date of Patent: Feb. 13, 2018

(54) INTEGRATED CIRCUIT WITH A POWER TRANSISTOR AND A DRIVER CIRCUIT INTEGRATED IN A COMMON SEMICONDUCTOR BODY

(71) Applicant: Infineon Technologies Austria AG, Villach (AT)

(72) Inventors: Anton Mauder, Kolbermoor (DE); Daniel Domes, Ruethen (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 692 days.

(21) Appl. No.: 14/040,883

(22) Filed: Sep. 30, 2013

(65) Prior Publication Data

US 2015/0091641 A1 Apr. 2, 2015

(51) Int. Cl.
*H01L 25/00* (2006.01)
*H01L 29/78* (2006.01)
*H01L 27/06* (2006.01)
*H01L 27/088* (2006.01)

(52) U.S. Cl.
CPC .......... *H01L 29/78* (2013.01); *H01L 27/0635* (2013.01); *H01L 27/088* (2013.01); *H01L 29/7813* (2013.01)

(58) Field of Classification Search
None
See application file for complete search history.

(56) References Cited

U.S. PATENT DOCUMENTS

| 2010/0171543 | A1* | 7/2010 | Korec et al. | 327/436 |
| 2011/0006361 | A1* | 1/2011 | Darwish et al. | 257/329 |
| 2013/0249001 | A1* | 9/2013 | Willmeroth et al. | 257/341 |
| 2013/0249602 | A1* | 9/2013 | Mauder et al. | 327/108 |

* cited by examiner

*Primary Examiner* — Lincoln Donovan
*Assistant Examiner* — Khareem E Almo
(74) *Attorney, Agent, or Firm* — Murphy, Bilak & Homiller, PLLC

(57) ABSTRACT

An integrated circuit includes a power transistor and a drive circuit. The drive circuit includes at least one drive transistor. The power transistor and the at least one drive transistor are integrated in a common semiconductor body. The power transistor includes at least one transistor cell with a source region, a body region, a drift region, a drain region, and a gate electrode adjacent the body region and dielectrically insulated from the body region by a gate dielectric. The at least one drive transistor includes active device regions integrated in a well-like structure comprising dielectric sidewall layers.

19 Claims, 8 Drawing Sheets

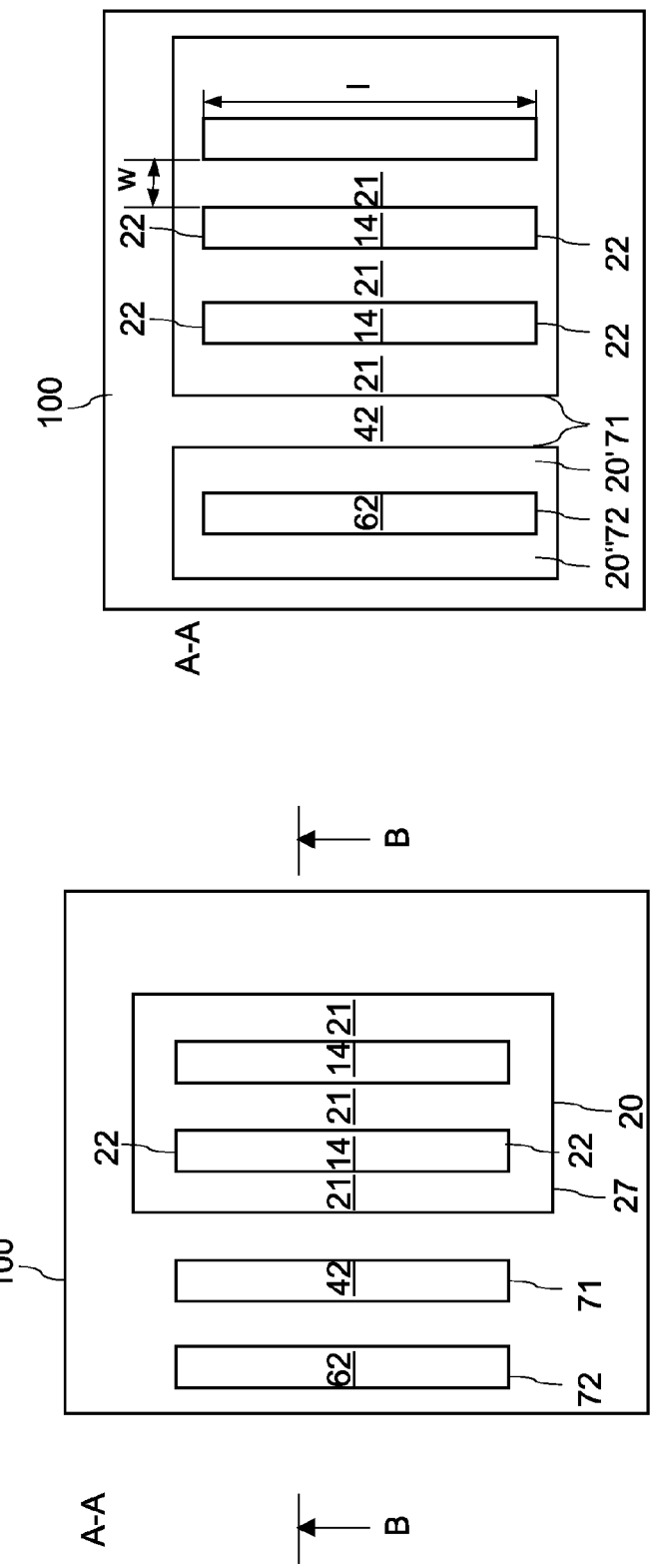

US 9,893,175 B2

INTEGRATED CIRCUIT WITH A POWER TRANSISTOR AND A DRIVER CIRCUIT INTEGRATED IN A COMMON SEMICONDUCTOR BODY

TECHNICAL FIELD

Embodiments of the present invention relate to an integrated circuit, in particular an integrated circuit with a power transistor and a driver circuit integrated in a common semiconductor body.

BACKGROUND

Power transistors, in particular power MOS transistors, such as power MOSFETs or power IGBTs, are widely used as electronic switches for switching electric loads, such as motors, actors, lamps, or the like. A power transistor is a voltage controlled device that can be controlled (switched on and off) by an electronic drive circuit configured to supply a drive signal to a control terminal (gate terminal) of the power transistor. The drive circuit may include at least one transistor.

A power transistor can be implemented to have a voltage blocking capability of several 100V. A voltage blocking capability of the at least one transistor of the drive circuit is usually selected such that this transistor is capable of withstanding a maximum signal level of the drive signal. This maximum signal level is, for example several 10V, such as about 20V. Thus, the at least one transistor of the drive circuit can be implemented with a much lower voltage blocking capability than the power transistor.

Power MOS transistors include a gate electrode that is operable to control a conducting channel in a body region of the transistor, and that is dielectrically insulated from the body region by a gate dielectric. Towards the end of a transistor manufacturing process it is desirable to test the gate dielectric for defects, wherein those MOS transistors that have a defective gate dielectric are discarded. Testing the gate dielectric may include applying a test voltage between the gate electrode and the body region and measuring a current through the gate dielectric. A MOS transistor may be discarded when the current is higher than a predefined threshold. The testing voltage is higher than the maximum signal level of the drive signal in a normal operation. For example, the testing voltage is between two times and five times the maximum signal level of the drive signal.

In order to save costs and in order to save space it is desirable, to integrate the power transistor and the driver circuit in the same semiconductor body. However the high voltages applied to the gate electrode of the power MOS transistor during the testing of the gate dielectric may destroy the at least one transistor of the drive circuit, if this transistor is not designed with a sufficiently high voltage blocking capability. However, a high voltage blocking capability of this transistor is usually associated with a high on-resistance and, therefore, with high driving losses.

There is therefore a need to provide an integrated circuit with a power transistor and a driver circuit integrated in a common semiconductor body, wherein the driver circuit can be implemented with at least one driver transistor having a relatively low voltage blocking capability.

SUMMARY

One embodiment relates to an integrated circuit including a power transistor and a drive circuit. The at least one drive transistor includes at least one drive transistor, wherein the power transistor and the at least one drive transistor are integrated in a common semiconductor body. The power transistor includes at least one transistor cell with a source region, a body region, a drift region, a drain region, a gate electrode adjacent the body region and dielectrically insulated from the body region by a gate dielectric, and a drift control region adjacent the drift region and dielectrically insulated from the drift region by a drift control region dielectric. The at least one drive transistor includes active device regions that are integrated in a well-like structure including dielectric sidewall layers.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 11 schematically illustrates a horizontal cross-sectional view of another embodiment of the semiconductor body shown in FIG. 8;

FIG. 13 schematically illustrates a horizontal cross-sectional view of the semiconductor body shown in FIG. 10.

DETAILED DESCRIPTION

In the following Detailed Description, reference is made to the accompanying drawings, which form a part thereof, and in which is shown by way of illustration specific embodiments in which the invention may be practiced. It is to be understood that the features of the various exemplary embodiments described herein may be combined with each other, unless specifically noted otherwise.

Figure 1:
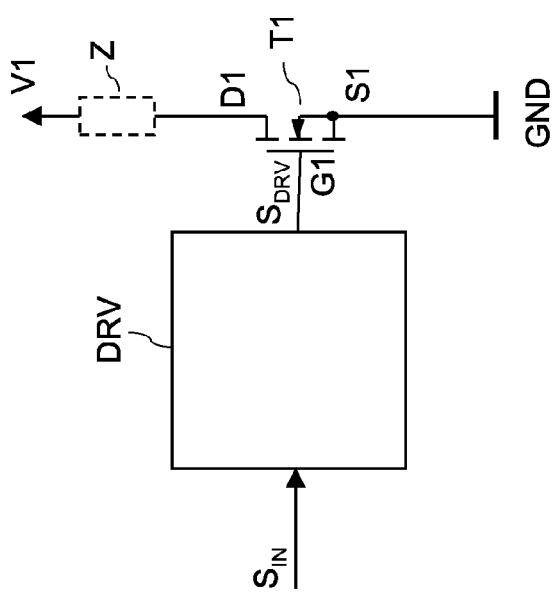
FIG. 1 schematically illustrates a circuit diagram of an integrated circuit including a power transistor and a drive circuit.

FIG. 1 illustrates a circuit diagram of an integrated circuit that includes a power transistor T1 and a drive circuit DRV. The drive circuit DRV is configured to drive the power transistor T1 dependent on an input signal $S_{IN}$ received by the drive circuit DRV. The power transistor T1 includes a control node G1 and a load path between a first load node D1 and a second load node S1. Just for the purpose of illustration it is assumed that the power transistor T1 illustrated in FIG. 1 is a MOSFET, specifically an n-type enhancement MOSFET. However, this is only an example. The power transistor could be implemented as another type of MOSFET (p-type MOSFET, depletion MOSFET) or as an IGBT (Insulated Gate Bipolar Transistor) as well. In the MOSFET illustrated in FIG. 1, the control node G1 is a gate node (gate terminal), and the first and second load nodes D1, S1 are drain and source nodes (drain and source terminals), respectively.

The MOSFET T1 shown in FIG. 1 is a voltage-controlled semiconductor device that is configured to switch on and switch off dependent on a signal level of a drive signal $S_{DRV}$ received from the drive circuit DRV at the gate node G1. This drive signal $S_{DRV}$ can be referenced to one of the drain and source nodes D1, S1, and is referenced to the source node S1 in the present embodiment. The MOSFET T1 switches on when a magnitude of the drive signal $S_{DRV}$ is higher than a predefined threshold voltage of the MOSFET T1, and the MOSFET T1 switches off when the magnitude of the drive signal $S_{DRV}$ is below the threshold voltage. In the n-type enhancement MOSFET T1 shown in FIG. 1, the threshold voltage is, for example, a positive voltage with a voltage level of about several volts.

The input signal $S_{IN}$ of the drive circuit DRV indicates a desired switching state of the power transistor T1. That is, the input signal $S_{IN}$ indicates whether it is desired to switch on or switch off the power transistor T1. According to one embodiment, the input signal $S_{IN}$ can assume two different signal levels, namely an on-level indicating that it is desired to switch on the power transistor T1, and an off-level indicating that it is desired to switch off the power transistor T1. The drive circuit DRV is configured to generate a signal level of the drive signal $S_{DRV}$ dependent on a signal level of the input signal $S_{IN}$ such that the drive signal $S_{DRV}$ switches on the power transistor T1 when the input signal $S_{IN}$ has an on-level, and that the drive signal $S_{DRV}$ switches off the power transistor T1 when the input signal $S_{IN}$ has an off-level.

As will be explained in further detail herein below, the power transistor T1 and at least parts of the drive signal DRV are integrated in one common semiconductor body.

Referring to FIG. 1, the power transistor T1 can be used to drive a load Z connected in series with the load path D1-S1 of the power transistor T1. A series circuit with the power transistor T1 and the load Z is coupled between a first supply node for a first supply potential V1, and a second supply node for a second supply potential or reference potential GND, respectively.

Figure 2:
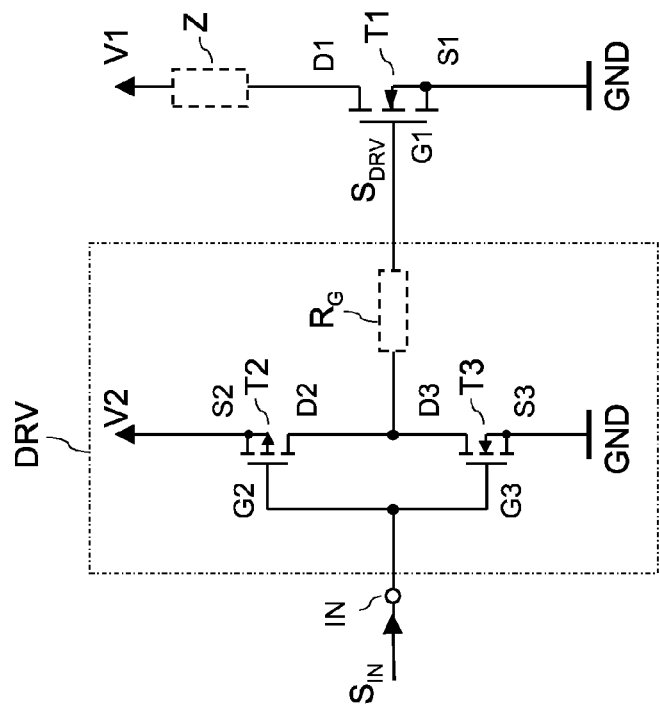
FIG. 2 illustrates a circuit diagram of one embodiment of a drive circuit that includes a half-bridge circuit with two transistors.

FIG. 2 illustrates one embodiment of the drive circuit DRV. In this embodiment, the drive circuit (driver) DRV includes a half-bridge circuit with a first drive transistor T2 and a second drive transistor T3. Each of these first and second drive transistors T2, T3 includes a control node and a load path between a first load node and a second load node.

The load paths of the first and second drive transistors T2, T3 are connected in series between a first drive potential node configured to receive a first drive potential V2, and a second drive potential node configured to receive a second drive potential GND. The second drive potential corresponds to the second supply potential GND in this embodiment. The first drive potential V2 may be lower than the first supply potential V1.

The half-bridge circuit includes an output node, which is a circuit node between the load paths of the first and second driver transistors T2, T3. This output node is coupled to the control node G1 of the power transistor T1. Optionally, a resistive element $R_G$ (that will be referred to as gate resistor $R_G$ in the following) is coupled between the output node of the half-bridge circuit and the control node G1 of the power transistor T1.

The half-bridge circuit shown in FIG. 2 is implemented with complementary transistors, that is the first drive transistor T2 and the second drive transistor T3 are complementary transistors. In the present embodiment, the first drive transistor T2 is a p-type transistor, specifically a p-type enhancement MOSFET, and the second drive transistor T3 is an n-type transistor, specifically an n-type enhancement MOSFET. Drain nodes D2, D3 of these first and second drive transistors T2, T3 are coupled to the output node of the half-bridge circuit. Gate nodes G2, G3 of the first and second drive transistors, respectively, are coupled to an input IN of the drive circuit DRV where the input signal $S_{IN}$ is available, so that each of the first and second drive transistors T2, T3 receives the input signal $S_{IN}$.

Figure 3:
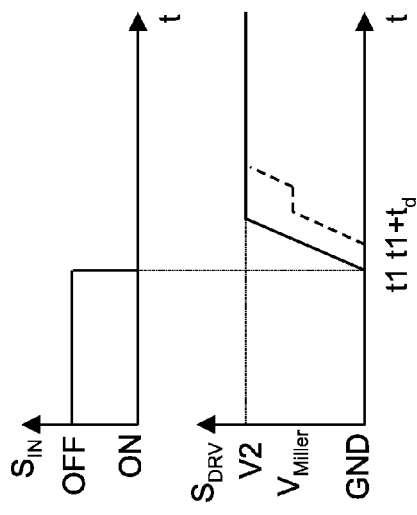
FIG. 3 shows timing diagrams that illustrate one way of operation of the drive circuit.

One way of operation of the drive circuit DRV is explained with reference to FIG. 3 below. FIG. 3 schematically shows timing diagrams of the input signal $S_{IN}$ and a drive signal $S_{DRV}$. Referring to FIG. 3, the input signal $S_{IN}$ has an off-level OFF before a first time t1. This off-level, which is a high level in the present embodiment, switches off the first drive transistor T2 and switches on the second drive transistor T3, so that the drive signal $S_{DRV}$ is substantially zero and switches off the power transistor T1. When the input signal $S_{IN}$ switches from the off-level OFF to the on-level ON the second drive transistor T3 switches off and the first drive transistor T2 switches on so that a signal level of the drive signal $S_{DRV}$ increases to the first drive potential V2. A rate at which the drive signal $S_{DRV}$ increases is dependent on an electrical resistance of the gate resistor $R_G$. This gate resistor $R_G$ may include parasitic resistances, such as line resistances, but may also include an integrated resistor.

Referring to FIG. 3, the drive circuit DRV of FIG. 2 has an inverting characteristic. That is, a low signal level of the input signal $S_{IN}$ causes a high signal level of the drive signal $S_{DRV}$ that switches on the power transistor T1, and a high signal level of the input signal $S_{IN}$ causes a low signal level of the drive signal $S_{DRV}$ that switches off the power off the power transistor T1. However, implementing the half-bridge circuit of the drive circuit DRV with complementary transistors T2, T3 is only an example. It is also possible (not illustrated) to implement the first and second drive transistors T2, T3 as transistors of the same conduction type, such as n-type transistors. In this case, one of the first and second drive transistors T2, T3 may receive the input signal $S_{IN}$ directly, while the other one of the first and second drive transistors T2, T3 may receive the input signal $S_{IN}$ through an inverter.

The timing diagram shown in solid lines in FIG. 3 illustrates the dependency of the drive signal $S_{DRV}$ on the input signal $S_{IN}$ in a simplified way neglecting delay times and the input characteristics of the power transistors T1. A more realistic but still simplified characteristic is illustrated in dashed lines. Referring to this more realistic characteristic, the drive signal $S_{DRV}$ starts to change its signal level after a delay time $t_d$ after a predefined (falling) edge of the input signal $S_{IN}$. Further, due to inevitable capacitances (Miller capacitance) of the power transistor T1 the timing diagram of drive signal $S_{DRV}$ includes a plateau region (Miller plateau) where the drive signal has a substantially constant signal level until the capacitances have been charged.

Figure 4:
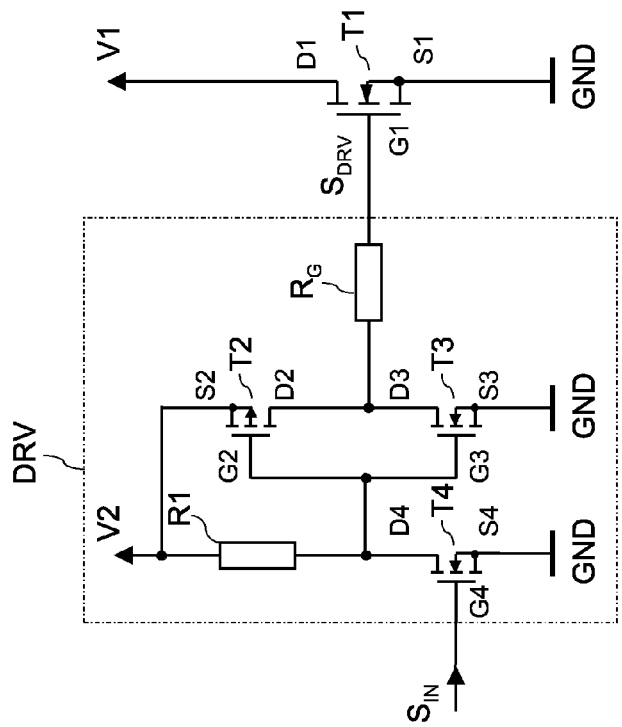
FIG. 4 illustrates a circuit diagram of a drive circuit that includes an input stage coupled to a half-bridge circuit.

FIG. 4 illustrates one embodiment of a drive circuit DRV that has a non-inverting characteristic. This drive circuit DRV includes an inverter R1, T4 that is configured to receive the input signal $S_{IN}$ and to drive the half-bridge circuit with the first and second drive transistors T2, T3. In the present embodiment, the inverter includes a third drive transistor T4 having a control node G4 and a load path between a first and second load node D4, S4. The load path D4, S4 of the third transistor T4 is connected in series with a resistor R1, wherein a series circuit with the third transistor T4 and the resistor R1 is coupled between the terminals for the first and second drive potentials V2, GND. An output of the inverter, which is a circuit node between the resistor R1 and the load path of the third transistor T4, is coupled to an input of the half-bridge circuit. In this embodiment, the input of the half-bridge circuit is a circuit node common to the control nodes G2, G3 of the first and second drive transistors T2, T3. The third transistor T4 is an n-type drive transistor, specifically an n-type MOSFET in the embodiment shown in FIG. 4. This transistor T4 is connected between the resistor R1 and the terminal for the second drive potential GND.

One way of operation of the drive circuit DRV shown in FIG. 4 is as follows: When the input signal $S_{IN}$ has an on-level that switches on the third transistor T4, a signal level at the input of the half-bridge circuit T2, T3 is substantially zero so that the first drive transistor T2 switches on and the second drive transistor T3 switches off. The signal level of the drive signal $S_{DRV}$ then substantially corresponds to the first drive potential V2, so that the power transistor T1 switches on. When the input signal $S_{IN}$ has an off-level that switches off the third transistor T4, a signal level at the input of the half-bridge circuit T2, T3 substantially corresponds to the first drive potential V2, so that the first drive transistor T2 switches off and the second drive transistor T3 switches on. A signal level of the drive signal $S_{DRV}$ then substantially corresponds to zero, so that the power transistor T1 switches off.

Figure 5:
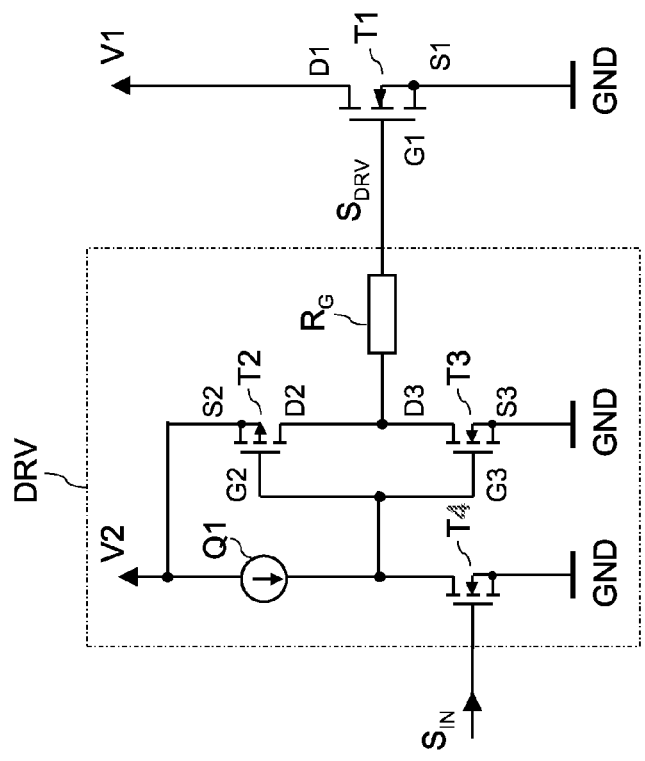
FIG. 5 illustrates a circuit diagram of another embodiment of a drive circuit that includes an input stage coupled to a half-bridge circuit.

FIG. 5 illustrates a modification of the drive circuit DRV shown in FIG. 4. In the drive circuit DRV shown in FIG. 5, the inverter includes a current source Q1 instead of the resistor R1.

Figure 6:
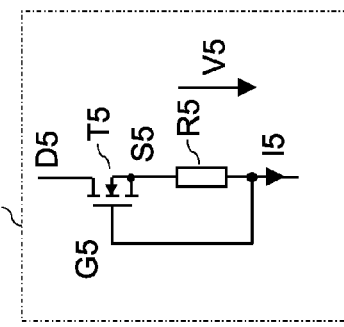
FIG. 6 illustrates one embodiment of a current source of the input stage shown in FIG. 5.

Referring to FIG. 6, this current source Q1 can be implemented with a transistor T5, such as an n-type enhancement MOSFET, and a resistor R5 connected in series with a load path of the transistor T5. The transistor T5 and the resistor R5 are connected such that a drive voltage of the transistor T5 corresponds to a voltage V5 across the resistor R5 when a current 15 flows through the series circuit with the transistor T5 and the resistor R5. The "drive voltage" of the transistor T5 is a voltage between a gate node G5 and a source node S5 in the present embodiment. In this current source Q1, the transistor T5 is controlled such that the current 15 through the transistor T5 and the resistor R5 is substantially constant.

Figure 7:
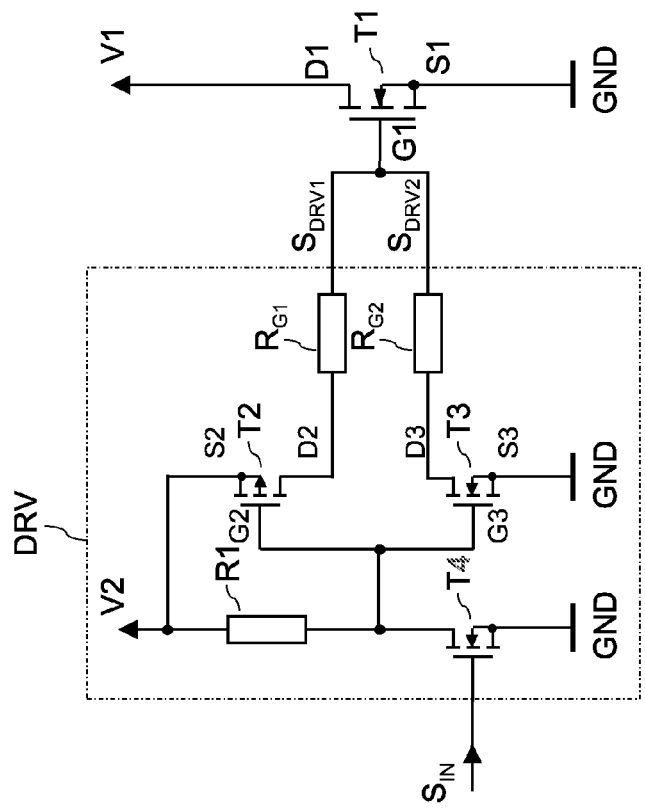
FIG. 7 illustrates a circuit diagram of a drive circuit according to a further embodiment.

FIG. 7 shows a modification of the drive circuit DRV explained hereinbefore. The drive circuit DRV shown in FIG. 7 is based on the drive circuit DRV shown in FIG. 4. However, the drive circuit shown in FIG. 7 could be based on each of the other drive circuits explained herein before as well.

The drive circuit shown in FIG. 7 is different from the half-bridge circuit shown in FIG. 4 in that the half-bridge circuit with the first and second drive transistors T2, T3 includes two outputs, namely a first output formed by the first load node (the drain node) D2 of the first drive transistor T2, and a second output formed by the first load node (the drain node) D3 of the second drive transistor T3. Each of these first and second outputs is coupled to the control node G1 of the power transistor T1, wherein a first gate resistor $R_{G1}$ is coupled between a first output and the control node G1, and a second gate resistor $R_{G2}$ is coupled between a second output and the control node G1. According to one embodiment, the first and second gate resistors $R_{G1}$, $R_{G2}$ have different resistances. This drive circuit DRV supplies a first drive signal $S_{DRV1}$ when the first drive transistor T2 is in an on-state (switched on), and supplies a second drive signal $S_{DRV2}$ when the second drive transistor T3 is in an on-state (switched on). By virtue of the presence of the two gate resistors $R_{G1}$, $R_{G2}$, these drive signals $S_{DRV1}$, $S_{DRV2}$ may have different slopes, so that the power transistor T1 can be switched on and switched off with different switching speeds.

The power transistor T1 and at least one of the drive transistors T2, T3 of the drive circuit DRV are integrated in a common semiconductor body. Embodiments of integrating the power transistor T1 and at least one of the drive transistors T2, T3 in a common semiconductor body are explained below.

Figure 8:
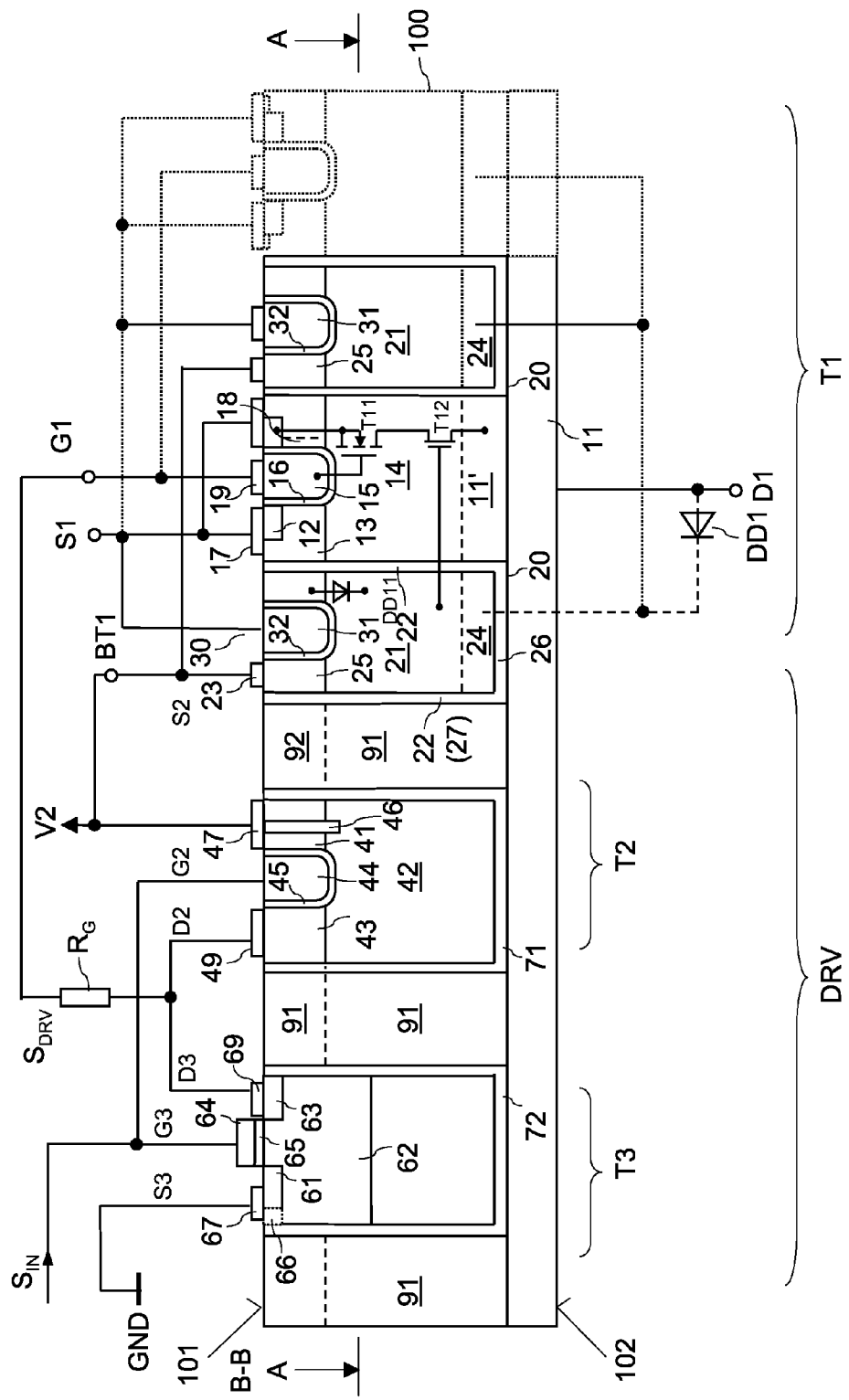
FIG. 8 illustrates a vertical cross-sectional view of one embodiment of a semiconductor body in which the power transistor and at least two transistors of the drive circuit are integrated.

FIG. 8 schematically illustrates a vertical cross-sectional view of a semiconductor body 100 in which active device regions of the power transistor T1 and of the first drive transistor T2 and the second drive transistor T3 are integrated. Just for illustration purposes, it is assumed that the power transistor T1 is a power MOSFET.

Referring to FIG. 8, the semiconductor body 100 includes a first surface 101 and a second surface 102 opposite the first surface 101. FIG. 8 shows the semiconductor body 100 in a vertical section plane that is perpendicular to the first and second surfaces 101, 102.

Referring to FIG. 8, the power MOSFET T1 includes a drain region 11, a source region 12, a body region 13 and a drift region 14. The drain and source regions 11, 12 are arranged distant in a current flow direction of the device, where the current flow direction is the vertical direction of the semiconductor body in the present embodiment. The body region 13 is arranged between the source region 12 and the drift region 14, and the drift 14 region is arranged between the body region 13 and the drain region. The drain region 11 is electrically connected to the drain terminal D1 that is only schematically illustrated in FIG. 8. The source region 12 and the body region 13 are electrically connected to a source electrode 17 which forms or which is connected to the source terminal S1.

The MOSFET further includes a gate electrode 15 which extends from the source region 12 through the body region 13 to or into the drift region 14. The gate electrode 15 is dielectrically insulated from the semiconductor regions implemented in the semiconductor body 100 by a gate dielectric 16, and is connected to the gate node G1. The gate dielectric 16 can be a conventional gate dielectric and includes, for example an oxide or a nitride. In the example illustrated in FIG. 8, the gate electrode 15 is a trench electrode that is arranged in a trench of the semiconductor body 100. However, this is only an example. The gate electrode 15 could also be implemented as a planar electrode (not shown) above the first surface 101 of the semiconductor body.

The power MOSFET T1 can be implemented as an n-type MOSFET or as a p-type MOSFET. In an n-type MOSFET, the source region 12 and the drain region are n-doped while the body region 13 is p-doped. In a p-type MOSFET, the source region and the drain region are p-doped while the body region 13 is n-doped. The doping concentration of the drain region and the source region 11, 12 is, for example in the range of between $5E17$ $cm^{-3}$ and $1$ $E21$ $cm^{-3}$. The doping concentration of the body region 13 is, for example, in the range of between $1E16$ $cm^{-3}$ and $1E19$ $cm^{-3}$. The doping concentration of the drift region 14 is, for example, in the range of between $1E12$ $cm^{-3}$ and $1E15$ $cm^{-3}$.

The MOSFET can be implemented as an enhancement (normally-off) MOSFET, or as a depletion (normally-on) MOSFET. In an enhancement MOSFET, the body region 13 extends to the gate dielectric 16. In a depletion MOSFET, either the body region 13 includes a channel region 18 (illustrated in dashed lines) of the same conductivity type as the source region 12 and extending along the gate dielectric between the source region 12 and the drift region 14, or the gate dielectric 16 includes fixed charges (positive charges in an n-type MOSFET) that cause a conducting channel in the body region 13 when the gate-source voltage is zero.

In the type of MOSFET illustrated in FIG. 8, the drift region 14 can have the same doping type (conductivity type) as the source region 12 and the drain region 11, but could also be doped complementarily to the source region 12 and the drain region 11, wherein at least a section of the drift region 14 between a vertical dielectric layer 22, which will be explained in the following, and a channel region of the MOSFET may have the same doping type as the source region 12. The "channel region" of the MOSFET is a section of the body region 13 along the gate dielectric 16 where the gate electrode controls a conducting channel.

The MOSFET further includes a drift control region 21 that is dielectrically insulated from the drift region 14 by the vertical dielectric layer 22. The vertical dielectric layer 22 acts as a drift control region dielectric. The drift control region 21 is configured to generate a conducting channel in the drift region 14 along the drift control region dielectric 22 when the MOSFET is in an on-state, so as to reduce the on-resistance of the MOSFET. The MOSFET, like a conventional MOSFET, is in the on-state, when to the gate node G1 an electrical potential is applied that causes a conducting channel in the body region 13 along the gate dielectric 16 between the source region 12 and the drift region 14, and when an electrical voltage is applied between the drain and the source terminals D, S. The conducting channel along the drift control region dielectric 22 is an accumulation channel when the drift region 14 has the same doping type as the source and drain regions 12, 11, and is an inversion channel, when the drift region 14 has a doping type that is complementary to these regions. The doping type of the drift control region 21 can correspond to the doping type of the drift region 14 or can be complementary.

The MOSFET further includes a biasing terminal BT1 coupled to the drift control region 21 via a contact electrode 23. According to one embodiment, the biasing terminal BT1 is coupled to the terminal for the first drive potential V2 of the drive circuit (DRV in FIGS. 2, 4-5, and 7). A capacitive element 30, such as a capacitor, may be coupled between the drift control region 21 and a terminal for a reference potential, such as the source terminal S1. This capacitive element 30 may be integrated in the semiconductor body 100, and includes a first capacitor electrode 31 coupled to the terminal for the reference potential (the source terminal) S1. A second capacitor electrode of the capacitive element 30 is formed by the drift control region 21, and a capacitor dielectric 32 is arranged between the first and second capacitor electrodes 21, 31.

A rectifier element DD1, such as a diode, may be connected between the drain region 11 and a drain-sided end of the drift control region 21. The "drain-sided end" of the drift control region 21 is that end of the drift control region 21 facing the drain region 11. This rectifier element acts as a voltage limiting element, which will be explained in further detail below. Referring to FIG. 8, the rectifier element DD1 can be connected to an optional connection region 24 that is of the same doping type as the source region 12, and that is more highly doped than the drift control region 21.

Referring to FIG. 8, the power MOSFET T1 may further include a semiconductor zone 25 of the same doping type as the body region 13 (or complementary to the doping type of the source region 12). In this case, the biasing terminal BT1 is connected to this semiconductor region 25 via the contact electrode 23, and this semiconductor region 25 may form at least a part of the second capacitor electrode.

One way of operation of the power MOSFET T1 shown in FIG. 8 is explained below. For explanation purposes it is assumed that the MOSFET is an n-type MOSFET with an n-doped drift zone 14, and that the drift control region 21 has the same doping type as the drift region 14. In the embodiment shown in FIG. 8, the biasing voltage V2 applied to the biasing terminal BT1 corresponds to the first drive potential V1 and is configured to bias the drift control region 21 to have a positive potential relative to the electrical potential (source potential) of the source terminal S1, when the MOSFET is in the on-state. The MOSFET is in the on-state, when the drive potential applied to the gate terminal G1 generates a conducting channel in the body region 13 between the source region 12 and the drift region 14, and when a positive voltage is applied between the drain and the source terminals D1, S1. In the on-state, the drift control region 21, which has a higher electrical potential than the drift region 14, generates an accumulation channel along the drift control region dielectric 22 in the drift region 14. This accumulation channel significantly reduces the on-resistance as compared to a MOSFET that does not include a drift control region.

The MOSFET is in the off-state, when the conducting channel in the body region 13 is interrupted. In this case, a depletion region expands in the drift region 14 beginning at a pn-junction between the body region 13 and the drift region 14. The depletion region expanding in the drift region 14 causes a depletion region also to expand in the drift control region 21. The drift control region 21, like the drift region 14, may include a monocrystalline semiconductor material. By virtue of a depletion region expanding in the drift region 14 and a depletion region expanding in the drift control region 21, a voltage across the drift control region dielectric 22 is limited.

The capacitive element 30 serves to store electrical charges that are required in the drift control region 21 when the MOSFET is in the on-state. The rectifier element DD1 allows charge carriers that are thermally generated in the drift control region 21 to flow to the drain region 11 and the drain terminal D1, respectively, so that the rectifier element DD1 limits the electrical potential of the drift control region 21. This rectifier element is connected up such that in the on-state of the MOSFET the drift control region 21 may assume a higher electrical potential than the potential at the drain terminal DD1, so that the drift control region 21 is not discharged.

In the power MOSFET T1 shown in FIG. 8, the drift control region 21 is not only dielectrically insulated from the drift region 14 by the vertical drift control region dielectric 22, but is also dielectrically insulated from the drain region 11 by a horizontal dielectric layer 26. The vertical drift control region dielectric 22 and the horizontal dielectric layer 26 form a dielectrically insulating well-like structure in which the drift control region 21 is arranged. This dielectric structure will be referred to as dielectric well in the following.

In the embodiment shown in FIG. 8, one drift region 14 is arranged between two drift control regions 21. A device structure including one gate electrode 15 and the corresponding gate dielectric 16, one drift region 14, one drift control region dielectric 22, and one drift control region 21 can be referred to as one transistor cell. (However, one may also consider a structure with one source region 12, one body region 13, one drift control region dielectric 22, one half of a drift control region 21, and one half of the drift region 14 as one transistor cell.) As illustrated in dotted lines in FIG. 1, the power transistor may include a plurality of transistor cells connected in parallel. The transistor cells are connected in parallel by having their source electrodes 17 connected to the (common) source node S1, by having their gate electrodes 16 connected to the (common) gate node G1, and by having the drift control regions 21 connected to the (common) biasing node BT1. The individual transistor cells may have the drain region 11 in common.

In a vertical direction of the semiconductor body 100, the drift region 14 may extend to the lateral dielectric layer 26. In this case a vertical position of the drain region 11 is only below the lateral dielectric layer 26. According to another embodiment (illustrated in dashed lines in FIG. 8), the drift region 14 does not extend to the lateral dielectric layer 26, so that a section 11' of the drain region 11 extends between two neighboring drift control region dielectrics 22 towards the first surface 101. In this case, the drain region 11 is below the lateral dielectric layers 26, and between sections of two neighboring vertical dielectric layers 22.

Figure 9:
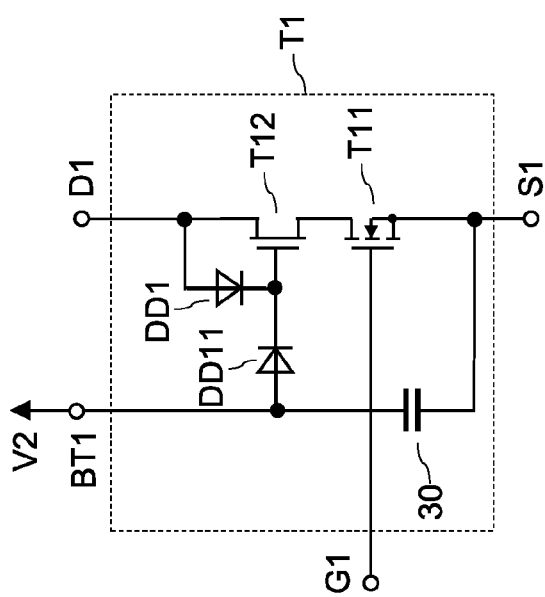
FIG. 9 illustrates the equivalent circuit diagram of the power transistor shown in FIG. 8.

FIG. 9 shows the equivalent circuit diagram of the power transistor T1 shown in FIG. 8. The circuit elements of this equivalent circuit diagram are also shown in FIG. 8 at the corresponding positions. Referring to FIG. 9, the circuit diagram includes a cascode circuit with a first MOSFET T11 and a second MOSFET T12 between the drain and source nodes D1, S1. Referring to FIG. 8, the first MOSFET T11 is formed by the source region 12, the body region 13, and a section of the drift region 14 adjoining the body region 13, the gate electrode 15, and the gate dielectric 16. This MOSFET T11 can be an enhancement MOSFET (as illustrated) or a depletion MOSFET. The second MOSFET T12 is a depletion MOSFET when the drift region has the same doping type (conductivity type) as the source region 12 and is formed by the drift region 14, the drain region 11, the drift control region 21, and the drift control region dielectric 22. The drift control region 21 acts as a gate electrode, and the drift control region dielectric 22 acts as a gate dielectric of this depletion MOSFET T12. As stated above, the second MOSFET T12 could also be implemented as a depletion MOSFET. In this case, the drift region has a doping type (conductivity type) complementary to the doping type (conductivity type) of the source region 12.

Referring to FIG. 9, the gate node (gate terminal) of the depletion MOSFET T12 is coupled to the biasing terminal BT1 via a diode DD11. This diode DD11 is formed by the pn-junction between the drift control region 21 and the semiconductor zone 25. The capacitor 30 shown in FIG. 9 represents the capacitive element 30 shown in FIG. 8 and is coupled between the biasing terminal BT1 and the source terminal S1 in the present embodiment.

Figure 10:
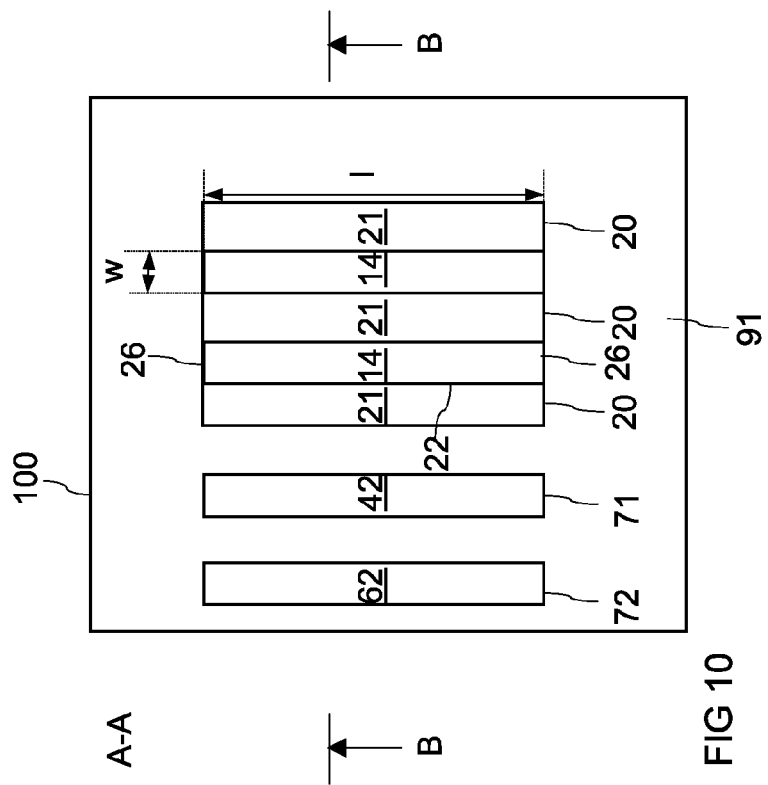
FIG. 10 schematically illustrates a horizontal cross-sectional view of one embodiment of the semiconductor body shown in FIG. 8.

FIG. 10 illustrates a horizontal cross sectional view of the semiconductor body 100 according to one embodiment. The cross section illustrated in FIG. 10 is a cross section of the drift control region 21, and the drift region 14. Referring to FIG. 10, in the semiconductor body 100 a plurality of dielectric wells 20 including the drift control region dielectric 22 and the horizontal dielectric layer 26 are integrated, with one drift control region 21 being arranged within each dielectric well 20. Referring to FIG. 10, the dielectric wells 20 can be longitudinal structures having a longitudinal direction extending in a lateral direction of the semiconductor body 100 and, therefore, perpendicular to the section plane illustrated in FIG. 10. The individual dielectric wells 20 are arranged distant to each other in a direction perpendicular to their longitudinal directions, wherein one drift region 14, at least one body region 13, at least one source region 12, a gate electrode 15 and a gate dielectric 16 is arranged between two dielectric wells 20. In FIG. 10, from these device regions, only the drift region 14 is shown.

A length l of the dielectric wells 20, which is a dimension in the longitudinal direction, is, for example, in the range of several micrometers (μm) up to several millimeters (mm). A width w of these dielectric wells 20, which is a dimension in a direction perpendicular to the longitudinal direction, is, for example, in the range of between several 10 nanometers (nm) up to several 10 μm, such as, e.g., between 100 nm and 20 μm, or between 500 nm and 5 μm. Although, for the purpose of illustration, only several dielectric wells 20 are illustrated in FIG. 2, the power transistor may include up to several 10.000 ($10^5$) transistor cells, with each transistor cell including a dielectric well 20 with a drift control region 21.

In the embodiment illustrated in FIG. 10, the MOSFET includes a plurality of drift regions 14, where the individual drift regions 14 are elongated semiconductor regions that are dielectrically insulated from the neighboring drift control regions 21 by the drift control region dielectric 22. The drift control region 21 is dielectrically insulated from the drain region 11 (not shown in FIG. 10) by the horizontal dielectric layer 26 shown in FIG. 8 (not shown in FIG. 10). At longitudinal ends, the individual drift regions 14 are dielectrically insulated by vertical dielectric layers 26 from a semiconductor region 91 that surrounds the drift regions 14 and the drift control regions 21 in horizontal directions. This semiconductor region 91 that is also illustrated in FIG. 8 may have the same doping concentration as the drift region 14. Referring to FIG. 8, there is an optional semiconductor region 92 of the same doping type and substantially the same doping concentration as the body region 13 between the semiconductor region 91 and the first surface 101.

In the embodiment shown in FIG. 10, there is a plurality of drift regions 14, wherein each drift region 14 is located between two dielectric wells 20, and has a longitudinal direction, which is a direction perpendicular to a direction in which two neighboring dielectric wells are spaced apart. In the longitudinal direction, each drift region 14 is terminated by the vertical dielectric layer 26 extending between a pair of two neighboring dielectric wells 20.

FIG. 11 shows a horizontal cross sectional view of a semiconductor body 100 according to a further embodiment. The vertical cross sectional view of this semiconductor body 100 in the section plane B-B corresponds to the vertical cross sectional view shown in FIG. 8. The embodiment shown in FIG. 11 is different from the embodiment shown in FIG. 10 in that the individual drift control regions 21 are formed by one contiguous semiconductor region that surrounds the individual drift regions 14 in horizontal directions, is dielectrically insulated from the drift control regions by the drift control region dielectrics 22, and is dielectrically insulated from the drain region (not shown in FIG. 11) by the horizontal dielectric layer 26 shown in FIG. 8. Further, this contiguous semiconductor region forming the drift control regions 21 is dielectrically insulated from the semiconductor region 91, and the optional semiconductor region 92 by another vertical dielectric layer (outer dielectric layer) 27. In this embodiment, the drift control regions are also adjacent longitudinal ends of the individual drift regions 41 and are dielectrically insulated from the drift regions at the longitudinal ends by the drift control region dielectric 22. Further, there is only one dielectric well having an outer sidewall formed by the (outer) vertical dielectric layer 27, a bottom formed by the horizontal dielectric layer 26 (see FIG. 8), and having a plurality of inner sidewalls formed by the drift control region dielectrics 22, wherein each drift control region dielectric 22 has the form of a closed loop and surrounds one drift region 14 in this embodiment.

Referring to FIGS. 8, 10 and 11, the semiconductor body 100 includes at least two further dielectric wells, namely a first dielectric well 71 in which active device regions of the first drive transistor T2 are integrated, and a second dielectric well 72 in which active device regions of the second drive transistor T3 are integrated. These first and second dielectric wells 71, 72 are spaced apart from each other in the horizontal direction of the semiconductor body 100, and are spaced apart from the drift control region 21. The semiconductor region 91, and the optional semiconductor region 92 is arranged between these dielectric wells 71, 72, and between the dielectric wells 71, 72 and the drift control regions 21.

The first and second drive transistors T2, T3 can be implemented in a conventional way. In the embodiment shown in FIG. 8, the first and second transistors T2, T3 are implemented with different transistor topologies. However, this is just to illustrate two different embodiments how each of the first and second transistors T2, T3 can be implemented. It is, of course, possible to implement these two transistors T2, T3 with the same topology, such as one of the topologies shown in FIG. 8, or to implement the first transistor T2 with the topology of the second transistor T3 shown in FIG. 8, and to implement the second transistor T3 with the topology of the first transistor T2 shown in FIG. 8.

In the present embodiment, the first drive transistor T2 includes a trench gate electrode 44 similar to the gate electrode 15 of the power transistor T1. In the first drive transistor T2, however, a source region 41 and a drain region 43 are arranged in a region of the semiconductor body 100 that adjoins the first surface 101, so that the source region 41 and the drain region 43 are accessible via the first surface 101. The source region 41 is electrically coupled to a source electrode 47, and the drain region 43 is electrically coupled to a drain electrode 49. The source electrode 47 forms a source node (source terminal) S2 of the first drive transistor T2, and the drain electrode 49 forms a drain node (drain terminal) D2 of the first drive transistor T2. A body region 42 of the first drive transistor T2 is arranged in the vertical direction of the semiconductor body 100 below the source and drain regions 41, 43. The gate electrode 44 extends adjacent the source region 41 and the drain region 43 into the body region 42, and is dielectrically insulated from the source region 41, the body region 42 and the drain region 43 by a gate dielectric 45. The gate electrode 44 forms a gate node (gate terminal) G2 of the first drive transistor T2. The body region 42 is electrically coupled to the source electrode 47 through a connection region 46 of the same doping type as the body region 42. This connection region 46 extends through the source region 41 and may be higher doped than the body region 42.

The first drive transistor T2 can be operated like a conventional MOSFET. The first drive transistor T2 is in an on-state when to the gate electrode 44 a drive potential is applied that generates a conducting channel in the body region 42 between the source region 41 and the drain region 43. The first drive transistor T2 can be implemented as an n-type transistor or as a p-type transistor (as shown in FIGS. 2, 4, 5, and 7). In a p-type transistor, the source region 41 and the drain region 43 are p-doped, while the body region 42 is n-doped. In an n-type transistor, these device regions are complementary to the corresponding device regions in a p-type transistor.

In the embodiment shown in FIG. 8, the source and drain regions 41, 43 of the first drive transistor T2 substantially extend as deep into the semiconductor 100 as the body regions 13 of the power transistor T1. However, this is only an example. It is also possible to implement the source and drain regions 41, 43 such that they extend less deep into the semiconductor body 100 from the first surface 101. As an example, at least one the source region 41 and the drain region 43 may be realized as shallow doping islands.

In the embodiment shown in FIG. 8, the source and drain regions 41, 43 of the second drive transistor are spaced apart in a first horizontal direction that is substantially perpendicular to a longitudinal direction of the dielectric well 71. However, this is only an example. It is also possible to implement this drive transistor such that these source and drain regions 41, 43 are spaced apart in a second horizontal direction perpendicular to the first horizontal direction (and perpendicular to the drawing plane shown in FIG. 8).

Referring to FIG. 8, the second drive transistor T3 includes a planar gate electrode 64 that is arranged above a first surface 101 of the semiconductor body 100, and is dielectrically insulated from a body region 62 by a gate dielectric 65. A source region 61 and a drain region 63 are arranged in the body region 62 and spaced-apart from each other. The source region 61 is electrically coupled to a source electrode 67 forming the source node (source terminal) S3 of the second drive transistor T3, and the drain region 63 is electrically coupled to a drain electrode 69 forming a drain node (drain terminal) D3 of the second drive transistor T3. The body region 62 is also coupled to the source electrode 67. Optionally, the body region 62 is connected to the source electrode 67 through a contact region 66 of the same doping type as the body region 62 but more highly doped.

The second drive transistor T3 can be implemented as an n-type MOSFET (as shown in FIGS. 2, 4, 5, and 7), or as a p-type MOSFET. In an n-type MOSFET, the source region 61 and the drain region 63 are n-doped, while the body region 62 is p-doped. In a p-type MOSFET, the individual device regions are doped complementary to the corresponding device regions in an n-type MOSFET.

In the embodiment shown in FIG. 8, the source and drain regions of the first and second drive transistors T2, T3 are distant in a direction that is perpendicular to a longitudinal direction of the corresponding dielectric well. That is, the source region 41 and the drain region 43 of the first drive transistor T2 are distant in a direction perpendicular to the longitudinal direction of the first dielectric well 71. Further, the source region 61 and the drain region 63 of the second drive transistor T3 are distant in a direction that is perpendicular to a longitudinal direction of the second dielectric well 72. However, this is only an example. It is also possible to implement at least one of the first and second transistors T2, T3 such that the source region and the drain region of the corresponding transistor are distant in the longitudinal direction of the corresponding dielectric well 71, 72.

The first and second drive transistors T2, T3 are connected with each other and are connected with the power transistor T1 as explained with reference to FIGS. 2, 4, 5, and 7 hereinbefore. Connections between the individual semiconductor devices are only schematically illustrated in FIG. 8. These electrical connections can be implemented using a conventional wiring structure (not shown) that includes metallization layers and/or polycrystalline semiconductor layers and insulation layers arranged above the first surface 101 of the semiconductor body 100.

In FIG. 8, a gate resistor $R_G$ is schematically illustrated. This gate resistor $R_G$ can be integrated in the wiring structure (not illustrated). According to one embodiment, the gate resistor $R_G$ is implemented as polycrystalline semiconductor layer in the wiring structure. According to a further embodiment, the gate resistor $R_G$ is implemented in a further dielectric well (not shown).

In the embodiment shown in FIG. 8, the first and second drive transistors T2, T3 of the drive circuit are integrated in the semiconductor body 100. Referring to FIG. 2, the drive circuit may only include these two transistors T2, T3. However, referring to FIGS. 2, 4, 5, and 7, it is also possible for the drive circuit to include additional electronic devices, such as the third drive transistor T4. According to one embodiment, these additional devices are also integrated in a semiconductor body 100, wherein each of these electronic devices can be integrated in one further dielectric well (not shown).

In the integrated circuit shown in FIG. 8, the gate dielectric 16 of the power transistor T1 can be tested at the end of the manufacturing process without damaging or destroying the first and second drive transistors T2, T3. In such testing process, a relatively high voltage can be applied between the gate terminal G1 and the source terminal S1 of the power transistor T1. The gate dielectric 16 of the power transistor T1 should be capable to withstand this voltage. This voltage is, for example, several times the maximum drive signal $S_{DRV}$ (gate-source voltage) occurring in a normal operation mode of the power transistor T1. In this testing process, a current flowing between the gate terminal G1 and the source terminal S1 is measured, wherein the gate dielectric 16 passes the test when this current is below a predefined current threshold. According to a further embodiment, the source terminal S1 and the drain terminal D1 of the power transistor T1 are electrical connected during the test of the gate electric.

Referring to FIG. 8, the drain region 11 of the power transistor may adjoin the further dielectric wells 71, 72 in which the first and second drive transistors T2, T3 are integrated. In the gate dielectric testing process, the testing voltage may be also present between the drain terminals D2, D3 of the first and second drive transistors T2, T3 and the drain region 11 of the power transistor T1. Since the dielectric wells 71, 72 are arranged between the drain regions 43, 63 of the first and second drive transistors T2, T3 and the drain region 11 of the power transistor T1, the dielectric wells 71, 72 protect the first and second drive transistors T2, T3 from being damaged or destroyed during the testing process. According to one embodiment, the drive circuit DRV is not connected to the supply potentials V2, GND and to the terminal for receiving the input signal $S_{IN}$ in the testing process.

Figure 12:
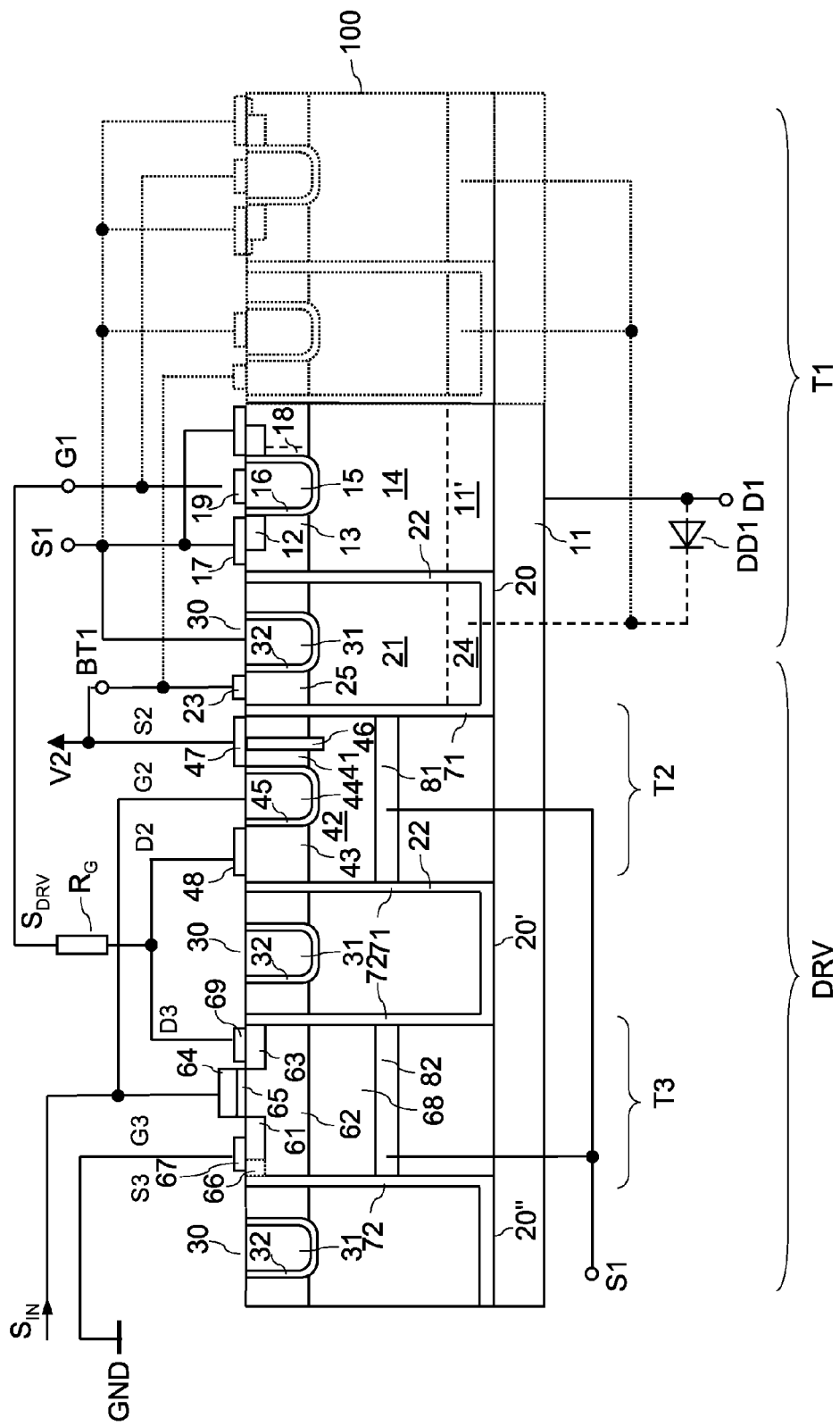
FIG. 12 illustrates a vertical cross-sectional view of a semiconductor body according to a further embodiment in which the power transistor and at least two transistors of the drive circuit are integrated.

FIGS. 12 and 13 illustrate a semiconductor body 100 according to another embodiment in which the power transistor T1 and at least the first and second drive transistors T2, T3 of the drive circuit DRV are integrated. FIG. 12 shows a vertical cross sectional view of the semiconductor body 100, and FIG. 13 shows a horizontal cross sectional view. In the embodiment shown in FIG. 13, the power transistor T1 with the drift regions 14, the drift control regions 21, and the drift control region dielectric 22 is implemented as explained with reference to FIG. 11. However, it is also possible to implement the power transistor in accordance with FIG. 10. Referring to FIGS. 12 and 13, each of the first and second drive transistors T2, T3 is integrated in a well-like structure that includes dielectric layers as sidewalls and a junction isolation (pn-junction) as a bottom. These well-like structures will be referred to as dielectrically insulating and junction isolating wells. In the embodiment shown in FIG. 12, each of the active device regions of the first and second transistor devices T2, T3 are arranged between two neighboring dielectric wells. In particular, the active device regions of the first drive transistor T2 are arranged between a first dielectric well 20 and a second dielectric well 20', and the active device regions of the second drive transistor T3 are arranged between the second dielectric well 20' and a third dielectric well 20". In the present embodiment, one of these dielectric wells, namely the first dielectric well 20, is a dielectric well including a drift control region 21 of the power transistor T1. The second and third dielectric wells 20', 20" are implemented like the first dielectric well 20, but do not include a drift control region 21, because these second and third dielectric wells 20', 20" are not adjoining a drift region of the power transistor T1. Optionally, the second and third dielectric wells 20', 20" include capacitor cells of the capacitive element 30 which is coupled between the drift region 21 and the source terminal S1. However, connections between the capacitor cells integrated in the second and third dielectric wells 20', 20" and the drift control region 21 and the source terminal S1 are not illustrated in FIG. 12.

The dielectrically insulating and junction isolating wells 71, 72 each include vertical dielectric layers as sidewalls, wherein these vertical dielectric layers are formed by sidewalls of the dielectric wells between which the active device regions of the corresponding transistor T2, T3 are integrated. Specifically, the first well 71 includes sidewalls formed by the first and the second dielectric well 20, 20', and the second well 72 includes sidewalls formed by the second well 20' and the third well 20".

Referring to FIG. 12, the wells 71, 72 further include vertical dielectric layers at longitudinal ends of the semiconductor regions in which the active device regions of the first and second transistors T2, T3 are integrated.

The junction isolation at the bottom of the individual wells 71, 72 is formed between a p-type semiconductor region and an n-type semiconductor region. In case of the first drive transistor T2, the n-type semiconductor region can be the body region 42 of the first drive transistor T2, and the p-type semiconductor region can be an additional semiconductor region 81 adjoining the body region 42 and arranged between the body region 42 and the drain region 11 of the power transistor T1. In case of the second drive transistor T3, the pn-junction can be formed between an n-doped semiconductor region 68 adjoining the body region 62, and an additional p-doped semiconductor region 82 adjoining the region 62. The semiconductor region 82 is arranged between the further region 68 and the body region 62, respectively, and the drain region 11 of the power transistor T1. The semiconductor regions 81, 82 that form the pn-junction and that are part of the junction isolation reach from one of the dielectric sidewalls to the other one of the dielectric sidewalls of each well 71, 72.

The semiconductor regions 81, 82 will be referred to as junction isolation regions in the following. Referring to FIG. 12, these junction isolation regions 81, 82 are electrically coupled to a terminal for a reference potential, such as the source terminal S1 of the power transistor T1.

Within the first and second wells 71, 72, the first and second drive transistors T2, T3 can be implemented as explained with reference to FIG. 8 hereinbelow.

During gate test either a positive or a negative potential may be applied to the gate G1 relative to the source S1 and optionally the drain D1 of the power transistor T1. According to one embodiment, the power transistor T1 is a n-channel transistor and the gate G1 is positively biased, the blocking junction is between the junction isolation regions 81, 82 on the potential of the source S1 and the n-body 42 of the transistor T2 or the n-insulation area 68 of the transistor T3. This requires that the n-layers 42 and 68 have to maintain a minimum width to support the voltage drop.

In the embodiments explained herein before, the two drive transistors T1, T2 are either integrated in dielectric wells 71, 72 or in dielectrically insulating and junction insulating wells. However it is also possible to combine these topologies such that one of the two transistors T2, T3 is integrated in a dielectric well, and the other one of the two transistors T2, T3 is integrated in a dielectrically insulating and junction insulating well.

Further, in the embodiments explained herein before, the includes a drift control region 21 adjacent a drift region 14 and dielectrically insulated from the drift region by a drift control region dielectric. However, the power transistor T1 is not restricted to having a drift control region and a drift control region dielectric. One embodiment of a (conventional) power transistor T1 that does not include a drift control region and a drift control region dielectric is shown in FIG. 14.

The power transistor (power MOSFET) T1 is integrated in a semiconductor body 100. The semiconductor body 100 includes a first surface 101 and a second surface 102 opposite the first surface 101. FIG. 14 shows the semiconductor body 100 in a vertical section plane that is perpendicular to the first and second surfaces 101, 102.

Figure 14:
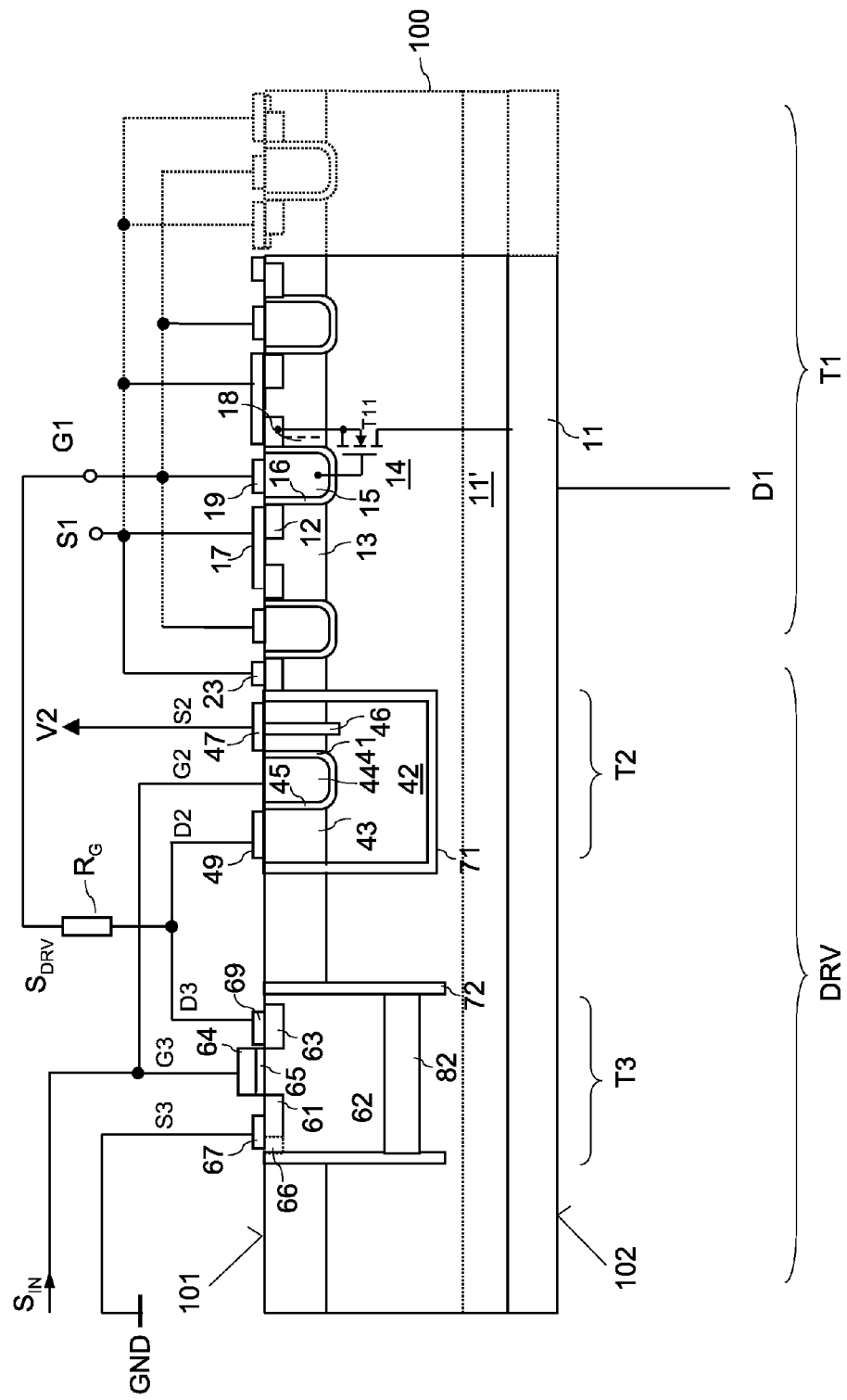
FIG. 14 illustrates a vertical cross-sectional view of another embodiment of a semiconductor body in which the power transistor and at least two transistors of the drive circuit are integrated.

Referring to FIG. 14, the power MOSFET T1 includes a drain region 11, a source region 12, a body region 13 and a drift region 14. The drain and source regions 11, 12 are arranged distant in a current flow direction of the device, where the current flow direction is the vertical direction of the semiconductor body in the present embodiment. The body region 13 is arranged between the source region 12 and the drift region 14, and the drift 14 region is arranged between the body region 13 and the drain region. The drain region 11 is electrically connected to the drain terminal D1 that is only schematically illustrated in FIG. 14. The source region 12 and the body region 13 are electrically connected to a source electrode 17 which forms or which is connected to the source terminal S1.

The MOSFET further includes a gate electrode 15 which extends from the source region 12 through the body region 13 to or into the drift region 14. The gate electrode 15 is dielectrically insulated from the semiconductor regions implemented in the semiconductor body 100 by a gate dielectric 16, and is connected to the gate node G1. The gate dielectric 16 can be a conventional gate dielectric and includes, for example an oxide or a nitride. In the example illustrated in FIG. 14, the gate electrode 15 is a trench electrode that is arranged in a trench of the semiconductor body 100. However, this is only an example. The gate electrode 15 could also be implemented as a planar electrode (not shown) above the first surface 101 of the semiconductor body.

The power MOSFET T1 can be implemented as an n-type MOSFET or as a p-type MOSFET. In an n-type MOSFET, the source region 12 and the drain region are n-doped while the body region 13 is p-doped. In a p-type MOSFET, the source region and the drain region are p-doped while the body region 13 is n-doped. The doping concentration of the drain region and the source region 11, 12 is, for example in the range of between $5E17\ cm^{-3}$ and $1E21\ cm^{-3}$. The doping concentration of the body region 13 is, for example, in the range of between $1E16\ cm^{-3}$ and $1E19\ cm^{-3}$. The doping concentration of the drift region 14 is, for example, in the range of $1E12\ cm^{-3}$ and $1E15\ cm^{-3}$.

The MOSFET can be implemented as an enhancement (normally-off) MOSFET, or as a depletion (normally-on) MOSFET. In an enhancement MOSFET, the body region 13 extends to the gate dielectric 16. In a depletion MOSFET, either the body region 13 includes a channel region 18 (illustrated in dashed lines) of the same conductivity type as the source region 12 and extending along the gate dielectric between the source region 12 and the drift region 14, or the gate dielectric 16 includes fixed charges (positive charges in an n-type MOSFET) that cause a conducting channel in the body region 13 when the gate-source voltage is zero.

Like in the embodiments explained herein before, the at least one transistor of the drive circuit DRV can be integrated in a dielectric well or a dielectrically and junction insulating well. FIG. 14 shows two drive transistors T2, T3, wherein a first drive transistor is integrated in a dielectric well 71, and the second drive transistor T2 is integrated in a dielectrically and junction insulating well 72, 82. However this is only an example, it is also possible to implement the first drive transistor T2 in a dielectrically and junction insulating well, and to integrate the second drive transistor T3 in a dielectric well 71, or to integrate both drive transistors either in a dielectric well, or a dielectrically and junction insulating well. The explanations provided concerning the drive transistors T2, T3 in connection with FIGS. 8 and 12 apply to the drive transistors T2, T3 shown in FIG. 14 accordingly.

In the embodiments explained herein before, the gate electrode 15 is arranged in a trench extending from the first surface 101 into the semiconductor body 100. The vertical sidewalls of the dielectric wells 71, 72 and of the dielectrically insulating and junction insulating wells also extend from the first surface 101 into the semiconductor body. According to one embodiment, the dielectric sidewalls extend from the first surface deeper into the semiconductor body 100 than the gate electrode. That is a lower end (an end facing away from the first surface 101) of the dielectric sidewalls is more distant to the first surface 101 than a lower end (an end facing away from the first surface 101) of the gate electrode 15.

According to one embodiment, a distance between the first surface 101 and the end of the dielectric sidewalls facing away from the first surface is at least 2 times, or at least 4 times a distance between the first surface 101 and an end of the gate electrode 15 facing away from the first surface 101.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated circuit comprising a power transistor and a drive circuit, wherein:
   the drive circuit comprises at least one drive transistor;
   the power transistor and the at least one drive transistor are integrated in a common semiconductor body;
   the power transistor comprises at least one transistor cell with a source region, a body region, a drift region, a drain region, and a gate electrode adjacent the body region and dielectrically insulated from the body region by a gate dielectric; and
   the at least one drive transistor comprises active device regions integrated in a well-like structure comprising dielectric sidewall layers.

2. The integrated circuit of claim 1, wherein the at least one transistor cell further comprises:
   a drift control region adjacent the drift region and dielectrically insulated from the drift region by a drift control region dielectric.

3. The integrated circuit of claim 1, wherein the well-like structure further includes a dielectric bottom layer.

4. The integrated circuit of claim 1, wherein the well-like structure further includes a bottom junction isolation.

5. The integrated circuit of claim 1, further comprising:
   a plurality of transistor cells,
   wherein the individual transistor cells have a common drain region.

6. The integrated circuit of claim 1, wherein the power transistor further comprises:
   a biasing terminal coupled to the drift control region.

7. The integrated circuit of claim 6, wherein the drive circuit comprises a supply terminal coupled to a terminal for supply potential, and wherein the biasing terminal is coupled to the terminal for the supply potential.

8. The integrated circuit of claim 6, further comprising:
   a capacitive element coupled between the biasing terminal and a reference node.

9. The integrated circuit of claim 8, wherein the reference node is a circuit node coupled to the source region.

10. The integrated circuit of claim 8, wherein the capacitive element is integrated in the semiconductor body.

11. The integrated circuit of claim 1, wherein the drive circuit comprises at least two transistors integrated in two different spaced apart well-like structures.

12. The integrated circuit of claim 11, wherein a capacitive element is integrated in a region of the semiconductor body between the two spaced apart well-like structures.

13. The integrated circuit of claim 1, wherein the at least one transistor of the drive circuit comprises a gate electrode arranged above a first surface of the semiconductor body.

14. The integrated circuit of claim 1, wherein the at least one transistor of the drive circuit comprises a gate electrode arranged in a trench extending from a first surface of the semiconductor body into the semiconductor body.

15. The integrated circuit of claim 4, wherein the at least one transistor of the drive circuit includes a body region, and wherein the junction isolation includes a semiconductor region adjoining the body region and forming a pn-junction with the body region.

16. The integrated circuit of claim 4, wherein the at least one transistor of the drive circuit includes a body region, wherein the junction isolation includes a semiconductor region adjoining the body region and a further semiconductor region, and wherein a pn-junction is formed between the semiconductor region adjoining the body region and the further semiconductor region.

17. The integrated circuit of claim 1, wherein the gate electrode is arranged in a trench extending from a first surface of the semiconductor body into the semiconductor body, and wherein the dielectric sidewalls extend from the first surface deeper into the semiconductor body than the gate electrode.

18. The integrated circuit of claim 17, wherein a distance between the first surface and an end of the dielectric sidewalls facing away from the first surface is at least twice a distance between the first surface and an end of the gate electrode facing away from the first surface.

19. The integrated circuit of claim 17, wherein a distance between the first surface and an end of the dielectric sidewalls facing away from the first surface is at least four times a distance between the first surface and an end of the gate electrode facing away from the first surface.

* * * * *